(12) United States Patent
Feurprier et al.

(10) Patent No.: US 11,087,973 B2
(45) Date of Patent: Aug. 10, 2021

(54) METHOD OF SELECTIVE DEPOSITION FOR BEOL DIELECTRIC ETCH

(71) Applicant: Tokyo Electron Limited, Tokyo (JP)

(72) Inventors: Yannick Feurprier, Watervliet, NY (US); Doni Parnell, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/843,344

(22) Filed: Dec. 15, 2017

(65) Prior Publication Data

US 2018/0174897 A1 Jun. 21, 2018

Related U.S. Application Data

(60) Provisional application No. 62/435,580, filed on Dec. 16, 2016.

(51) Int. Cl.
*H01L 21/02* (2006.01)
*H01L 21/3105* (2006.01)
*H01L 21/768* (2006.01)

(52) U.S. Cl.
CPC .... *H01L 21/02315* (2013.01); *H01L 21/0214* (2013.01); *H01L 21/0217* (2013.01); *H01L 21/0234* (2013.01); *H01L 21/02126* (2013.01); *H01L 21/02164* (2013.01); *H01L 21/02203* (2013.01); *H01L 21/02252* (2013.01); *H01L 21/02359* (2013.01); *H01L 21/02362* (2013.01); *H01L 21/3105* (2013.01);
(Continued)

(58) Field of Classification Search
CPC ........... H01L 21/76826; H01L 21/0228; H01L 21/3105; H01L 21/02362; H01L 21/02359; H01L 21/0234; H01L 21/02252; H01L 21/02164; H01L 21/02312; H01L 21/02315
See application file for complete search history.

(56) References Cited

U.S. PATENT DOCUMENTS

2006/0281329 A1 12/2006 Ramachandrarao
2008/0311755 A1* 12/2008 Zin ..................... H01L 21/3105
438/700
(Continued)

FOREIGN PATENT DOCUMENTS

WO 2014158462 A1 10/2014

OTHER PUBLICATIONS

European Patent Office, The International Search Report and the Written Opinion for International application No. PCT/US2017/066639, dated Mar. 23, 2018, 12 pages.

*Primary Examiner* — Laura M Menz
*Assistant Examiner* — Candice Chan

(57) ABSTRACT

Embodiments of the invention address several issues and problems associated with etching of dielectric materials for BEOL applications. According to one embodiment, the method includes providing a patterned substrate containing a dielectric material, exposing the substrate to a gas phase plasma to functionalize a surface of the dielectric material, exposing the substrate to a silanizing reagent that reacts with the functionalized surface of the dielectric material to form a dielectric film, and sequentially repeating the exposing steps at least once to increase a thickness of the dielectric film. According to one embodiment, the dielectric material may be a porous low-k material, and the dielectric film seals the pores on a surface of the porous low-k material.

21 Claims, 10 Drawing Sheets

(52) U.S. Cl.
CPC .. *H01L 21/76826* (2013.01); *H01L 21/76831* (2013.01); *H01L 21/76877* (2013.01)

(56) References Cited

U.S. PATENT DOCUMENTS

2010/0055442 A1   3/2010   Kellock et al.
2016/0093485 A1   3/2016   Kobayashi et al.

\* cited by examiner

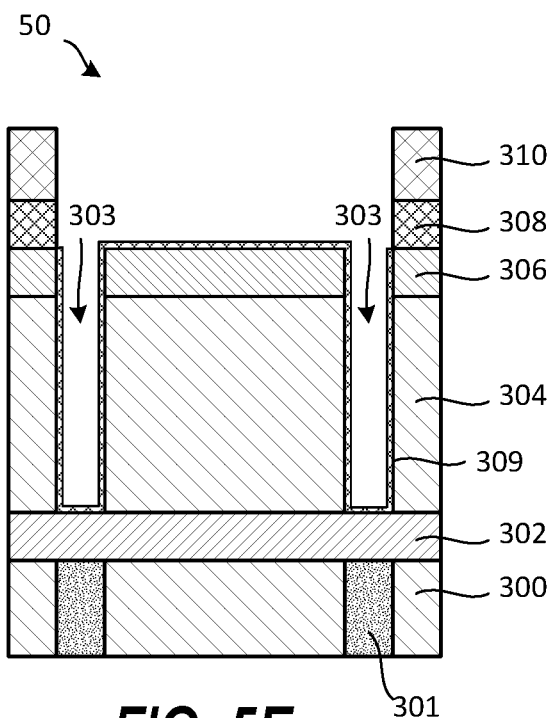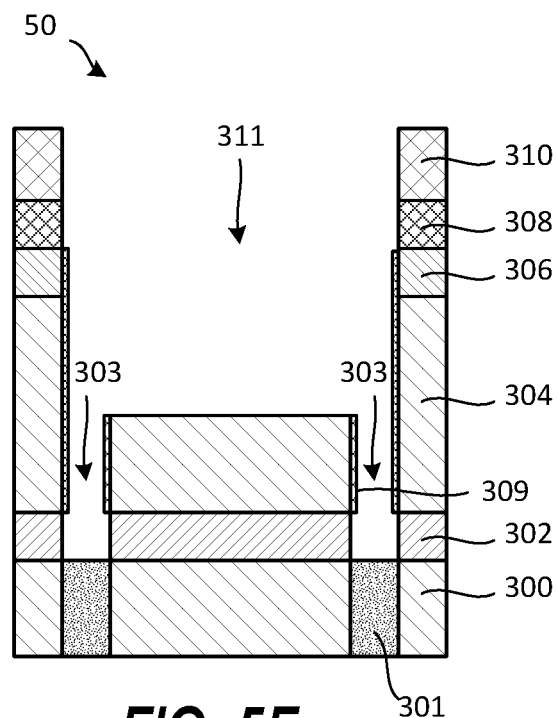

METHOD OF SELECTIVE DEPOSITION FOR BEOL DIELECTRIC ETCH

CROSS-REFERENCE TO RELATED APPLICATIONS

This application is related to and claims priority to U.S. Provisional patent Application Ser. No. 62/435,580 filed on Dec. 16, 2016, the entire contents of which are herein incorporated by reference.

FIELD OF INVENTION

The present invention relates to the field of dry etching of low-k materials and their treatment for integration in the back-end-of-line (BEOL) part of the integrated circuit (IC) fabrication process where the interconnects are made.

BACKGROUND OF THE INVENTION

The advancement of the technology for the chip design is calling for the integration of low-k value dielectric materials in the various BEOL levels. As a result, the search for low-k materials has resulted in incorporation of more carbon (C) and some porosity in the dielectric materials. Consequently, the low-k materials are getting more prone to damage during dry etch plasma processes, including during the via etch, the trench etch, the strip of an organic planarizing layer (OPL), and post etch treatment (PET). The critical dimensions (CD) of the Cu interconnects are also directly influenced by the amount of damage of the low-k materials. The CD and profile control of the via, the trench, and the spacing between the via and the trench, are getting more critical at smaller dimensions in order to achieve good reliability.

SUMMARY OF THE INVENTION

Embodiments of the invention describe processing of substrates containing dielectric materials. According to one embodiment, the method includes providing a patterned substrate containing a dielectric material, exposing the substrate to a gas phase plasma to functionalize a surface of the dielectric material, exposing the substrate to a silanizing reagent that reacts with the functionalized surface of the dielectric material to form a dielectric film on the dielectric material, and sequentially repeating the exposing steps at least once to increase a thickness of the dielectric film.

According to another embodiment, the method includes providing a patterned substrate containing a SiCOH layer, exposing the substrate to an $O_2$-based or $CO_2$-based gas phase plasma to functionalize a surface of the SiCOH layer, exposing the substrate to a silanizing reagent that reacts with the functionalized surface of the SiCOH layer to form a $SiO_x$ film on the SiCOH layer, and sequentially repeating the exposing steps at least once to increase a thickness of the SiOx film.

According to another embodiment, the method includes providing a patterned substrate containing a porous low-k material, exposing the substrate to an $O_2$-based or $CO_2$-based gas phase plasma to functionalize a surface of the porous low-k material, exposing the substrate to a silanizing reagent that reacts with the functionalized surface of the porous low-k material to form a dielectric film on the porous low-k material, and sequentially repeating the exposing steps at least once to increase a thickness of the dielectric film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 5A-5F schematically show through cross-sectional views a method of processing a patterned substrate according to an embodiment of the invention;

DETAILED DESCRIPTION OF SEVERAL EMBODIMENTS

Embodiments of the invention address several issues and problems associated with etching of dielectric materials for BEOL applications, including a) how to mitigate low-k material damage, b) how to achieve a high via chamfer angle, c) how to seal the pores of porous low-k materials, d) how to better maintain the via and trench CDs after etching, wet cleaning, and Cu metallization, e) how to obtain a straighter pattern profile (trench and via) of a stack containing multiple layers of low-k materials, and f) how to suppress the interaction between a low-k material and a planarizing material.

Embodiments of the invention relate to a method of processing a dielectric material. According to one embodiment, the method provides selective deposition of a thin dielectric film onto a dielectric material. According to some embodiments, the dielectric film can include $SiO_x$, $SiN_x$, $SiO_xN_y$, or a combination thereof, and the dielectric material can include $SiO_2$, SiN, SiCN and SiC, a low-k material (for example SiCOH), an Organo Silicate Glass (OSG), or a Carbon Doped Oxide (CDO).

The method includes a step of surface functionalization of a dielectric material by means of plasma processing, and a step of exposing the functionalized surface to a silanizing reagent. The two step process results in deposition of a thin dielectric film on the dielectric material, where the two step process may be repeated at least once to increase a thickness of the dielectric film on the dielectric material. One process cycle includes a surface functionalization step and a silanizing step, and a thickness of the deposited dielectric film is proportional to the number of process cycles. Chemical composition of the dielectric film may be selected and adjusted by varying the chemical environment of the surface functionalization and the silanizing reagent. In some examples, the chemical environment for the surface functionalization can be selected from $N_2$-based, $N_2/H_2$-based, $O_2$-based, $CO_2$-based, COS-based, $NH_3$-based, $H_2$-based, and $H_2O$-based. The surface functionalization can, for example, include —OH species, —NH species, and —SH species.

According to one embodiment, the surface functionalization step can include plasma oxidation of a surface of the dielectric material to form surface species with reactive bonds (for example silanol with Si—OH bonds). The plasma oxidation is followed by a step of exposing the dielectric material to a silanizing reagent, for example trimethylsilane dimethylamine (TMSDMA). The process cycle may be repeated at least once to deposit a thin $SiO_x$ (x≤2) film on the dielectric material. Experimental data showed that a thickness of the deposited SiO film is directly proportional to the number of process cycles.

Figure 1:
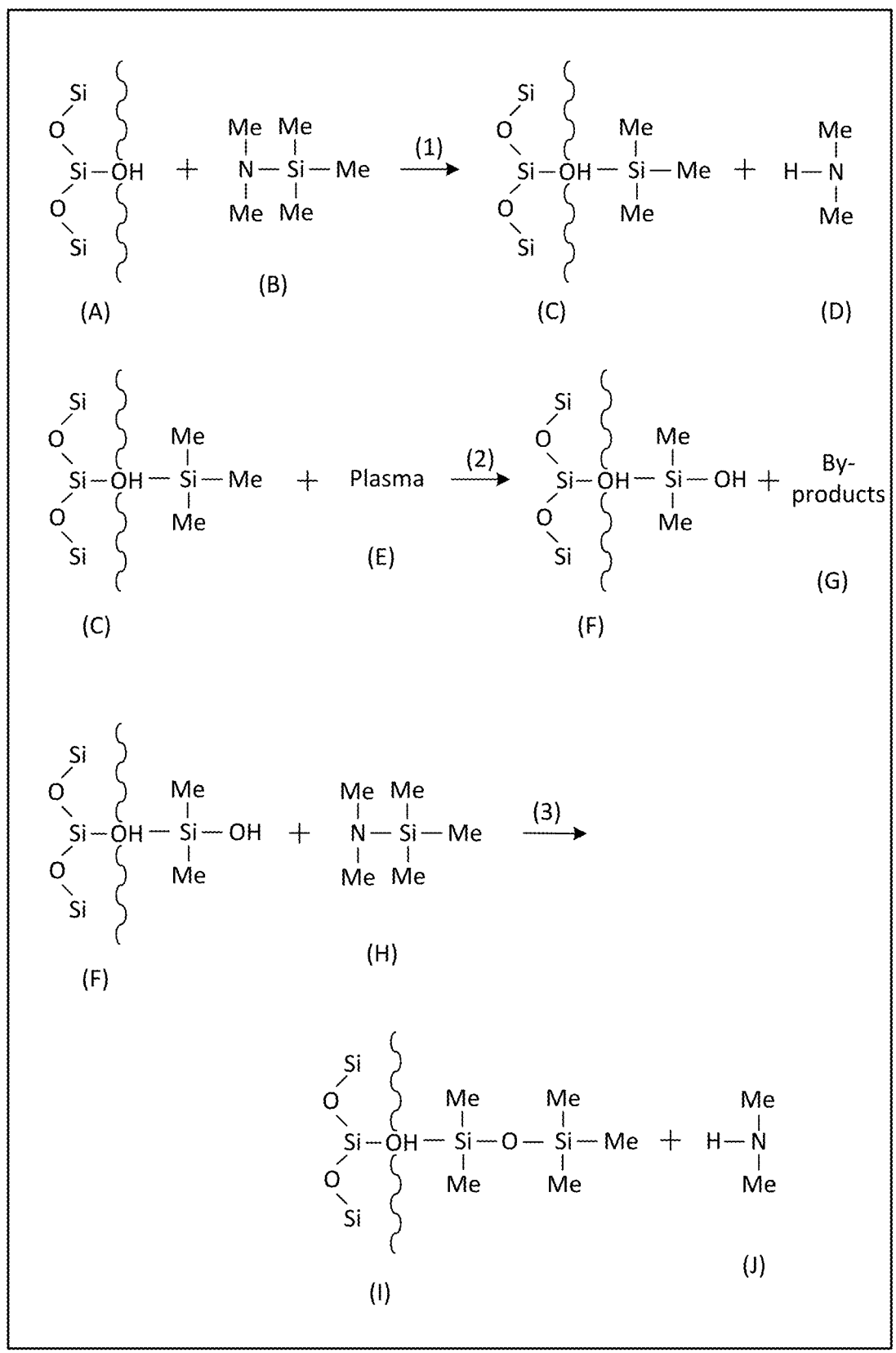
FIG. 1 schematically shows a method of functionalizing a surface of a dielectric material and silanizing the functionalized surface according to an embodiment of the invention.

FIG. 1 schematically shows a method of functionalizing a surface of a dielectric material and silanizing the functionalized surface according to an embodiment of the invention. In general, the basic silanizing reactions depicted in FIG. 1 apply to any silanizing reagent. According to some embodiments of the invention, silanizing reagent may be selected from dimethylsilane dimethylamine (DMSDMA), trimethylsilane dimethylamine (TMSDMA), bis(dimethylamino) dimethylsilane (BDMADMS), tetramethyldisilazane (TMDS), and other alkyl amine silanes. The silanizing reaction includes thermally reacting in step (1) the silanizing reagent (B) with a hydrophilic site (e.g., —OH) on a surface of a dielectric material (A) at a substrate temperature below approximately 200° C. In the case of TMSDMA, the silanizing reaction bonds a $SiMe_3$ group to the hydrophilic site to form a silanized dielectric material (C) and $HNMe_2$ reaction by-products (D) that are removed from the silanized dielectric material (C). The silanized dielectric material (C) can be referred to as a SiO film. The TMSDMA silanizing reaction may be performed in a process chamber where a wafer (substrate) is placed on a substrate holder heated to 180° C. and exposed to a gas mixture containing TMSDMA and $N_2$ at a gas pressure of 5 Torr.

The silanizing reagent may have the chemical formula $R_nSiX_{4-n}$, where R is an alkyl group or a functional chain, X is OR, $NH_2$, or $NR_2$, and n=0-4. In one example, the silanizing reagent can be an organo alkoxysilane reagent such as tetraethoxysilane ($Si(OEt)_4$, TEOS). In another example, the silanizing reagent can include dimethyldimethoxysilane (DMDMOS) or dimethyldiethoxysilane (DMDEOS).

Still referring to FIG. 1, according to an embodiment of the invention, a process cycle includes a step (2) of surface functionalization of a dielectric material (C) (e.g., a silylated surface) by means of plasma processing (E) (e.g., plasma oxidation containing $O_2$ gas or $CO_2$ gas). The surface functionalization further forms reaction by-products (G) that are removed. A subsequent step (3) includes exposing the functionalized surface (F) to a silanizing reagent (H) to form the $SiO_x$ film (I) and $HNMe_2$ reaction by-products (J) that are removed. The step of surface functionalization forms a dielectric material surface (F) that is reactive towards the silanizing reagent (H). The process cycle of steps (2) and (3) may be repeated at least once to increase a thickness of the $SiO_x$ film on the dielectric material. The process cycle provides selective growth of a thin $SiO_x$ film that may contain carbon and hydrogen. In the example shown in FIG. 1, the methyl groups (Me) contain carbon and hydrogen.

Figure 2:
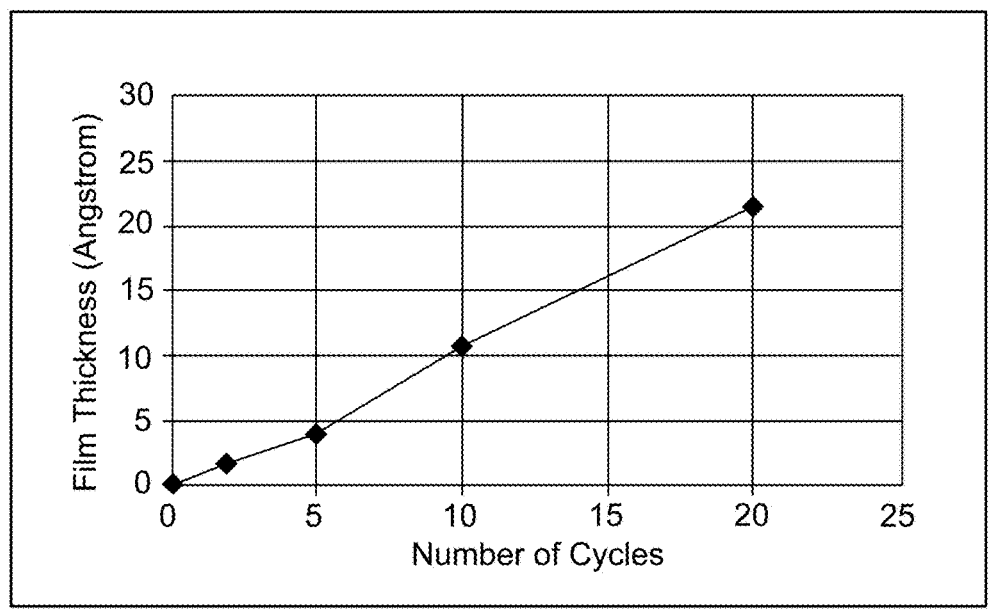
FIG. 2 shows a dielectric film thickness as a function of number of process cycles according to an embodiment of the invention.

FIG. 2 shows a dielectric film thickness as a function of number of process cycles according to an embodiment of the invention. $SiO_x$ films were deposited on wafers having a blanket SiCOH films thereon using process cycles containing alternating steps of $O_2$ plasma oxidation and TMSDMA gas exposure. The $O_2$ plasma oxidation was performed for 5 seconds without applying radio frequency (RF) bias power to the wafers. This plasma processing conditions resulted in relatively low energy of ions impacting the surface of the wafer. The ions were accelerated through the plasma sheath with a potential equal to the plasma potential. The $SiO_x$ film thickness was measured by ellipsometry. FIG. 2 shows that the $SiO_x$ film thickness was linear with the number of process cycles up to at least 20 process cycles, and that about 1 Angstrom (Å) of $SiO_x$ was deposited per process cycle. Thus, the $SiO_x$ film thickness may be directly controlled by the number of process cycles.

The effect of different plasma oxidation times on $SiO_x$ film deposition rates was studied using $O_2$ gas and $CO_2$ gas. Two different plasma oxidation times, 5 seconds and 10 seconds of $O_2$ and $CO_2$ gas plasma exposures, were investigated for 10 process cycles. The thickness of all the deposited $SiO_x$ films was about 1 nm, thereby showing that the functionalization of the dielectric material surface is readily achieved within several seconds of the plasma treatment.

Examples of Selective Deposition of Dielectric Films for BEOL Dielectric Etch

Figure 3A:
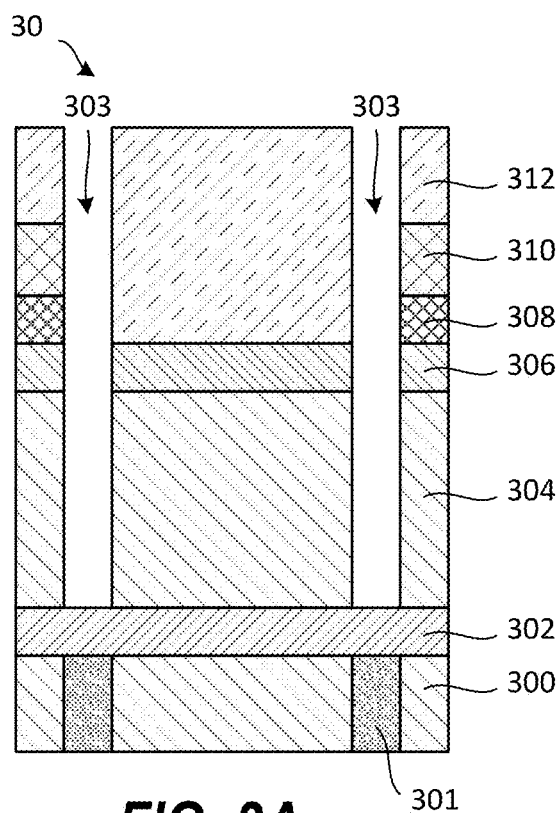
FIGS. 3A-3F schematically shows through cross-sectional views a method of processing a patterned substrate according to an embodiment of the invention.

FIGS. 3A-3F schematically shows through cross-sectional views a method of processing a patterned substrate according to an embodiment of the invention. In this embodiment, the method helps mitigate low-k material damage by forming a dielectric film on the low-k material, where the dielectric film acts as a barrier against carbon depletion as an organic film is stripped from the patterned substrate. In FIG. 3A, the patterned substrate 30 contains vias 303 etched through layers of an organic planarization layer (OPL) 312, a patterning hardmask (HM) 310, a metal hardmask 308, a dielectric hardmask 306, a SiCOH layer 304, and stopping on the etch stop layer 302. The SiCOH layer 304 is a low-k layer with a dielectric constant (k) that is lower than that of $SiO_2$ (k~3.9). According to one embodiment, the etch stop layer 302 can contain or consist of Si, C, H, and N. The etch stop layer may consist of a single material, or alternatively, may contain multiple materials with different compositions.

Figure 3B:
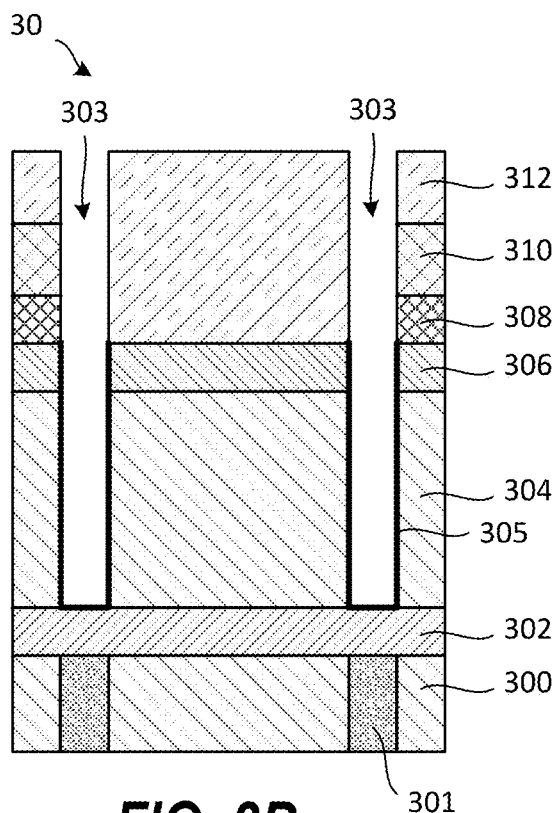

Following formation of the vias 303 by gas phase etching, an oxygen-based ashing process may be performed to remove CHF etch products from the patterned substrate 30 and to functionalize surfaces of the dielectric materials. The surface functionalization creates Si—OH surface termination 305 on the surfaces of the dielectric hardmask 306, the SiCOH layer 304, and the etch stop layer 302. As depicted in FIG. 3B, the oxygen-based ashing process also removes a portion of the thickness of the OPL 312.

Figure 3C:
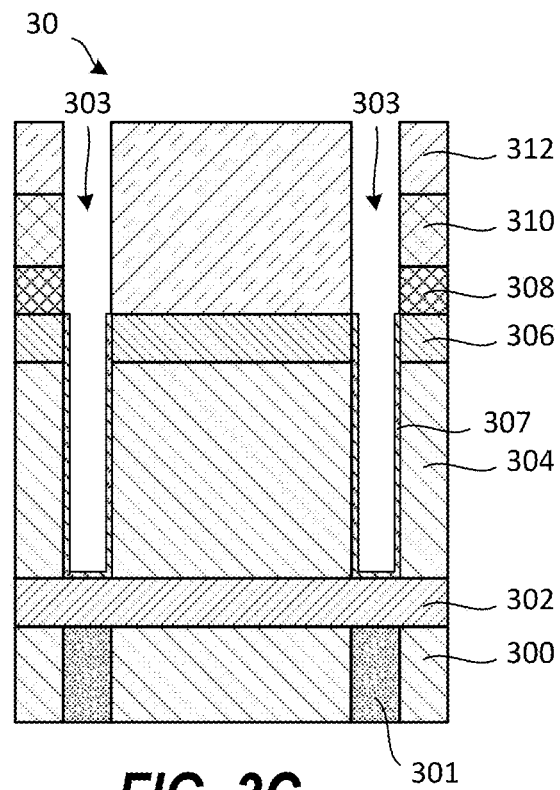

Thereafter, the Si—OH surface termination 305 is silylated by an exposure to a silanizing reagent (e.g., TMSDMA) to form a $SiO_x$ film 307 (e.g., Si—O—$SiMe_3$) on the dielectric hardmask 306, the SiCOH layer 304, and the etch stop layer 302 in the vias 303. This is schematically shown in FIG. 3C.

Figure 3D:
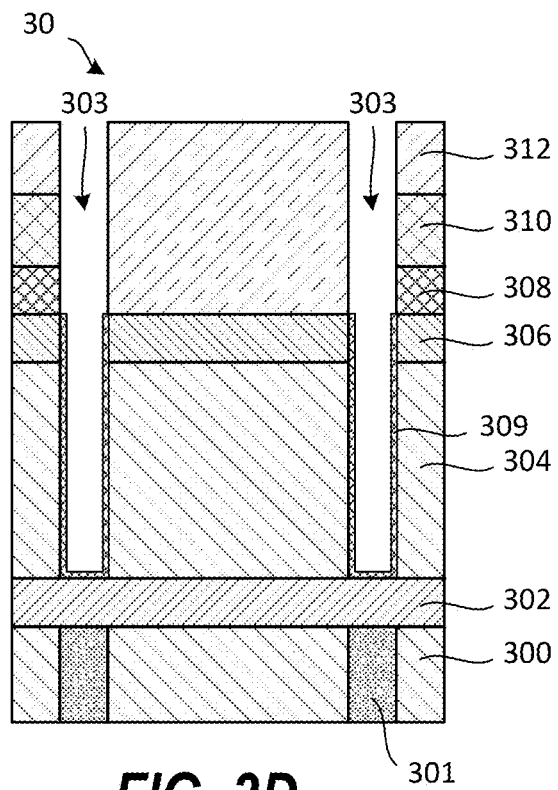
Figure 3E:
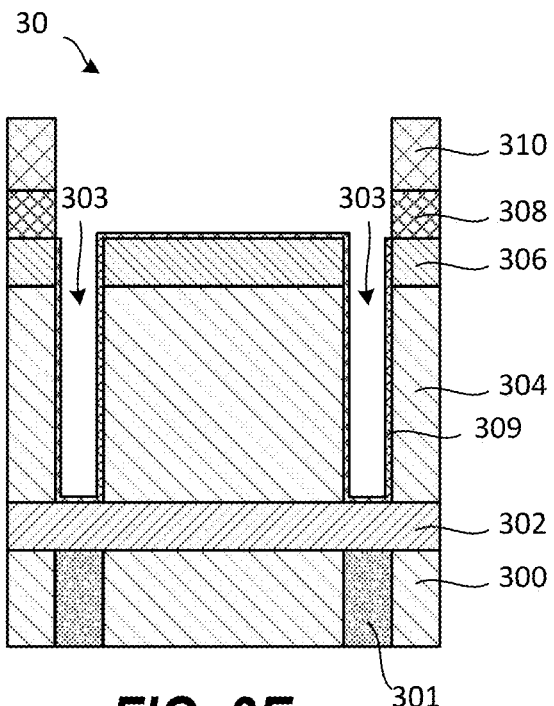

An oxygen-based plasma ashing process may be performed on the $SiO_x$ film 307 to regenerate the Si—OH surface termination. Multiple process cycles of an oxygen-based ashing and silanizing may be formed to increase a thickness of the $SiO_x$ film 307 in the vias 303 and form a $SiO_x$ film 309 (FIG. 3D). Each ashing step removes a portion of the OPL 312 but the $SiO_x$ film 309 protects the surfaces of the dielectric hardmask 306 and the SiCOH layer 304 in the vias 303 from carbon depletion. In FIG. 3E, the OPL 312 has been fully removed.

Figure 3F:
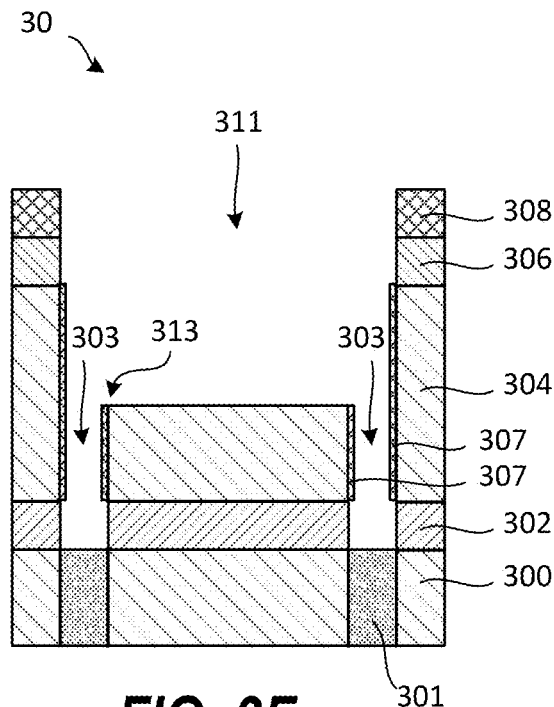
Figure 4:
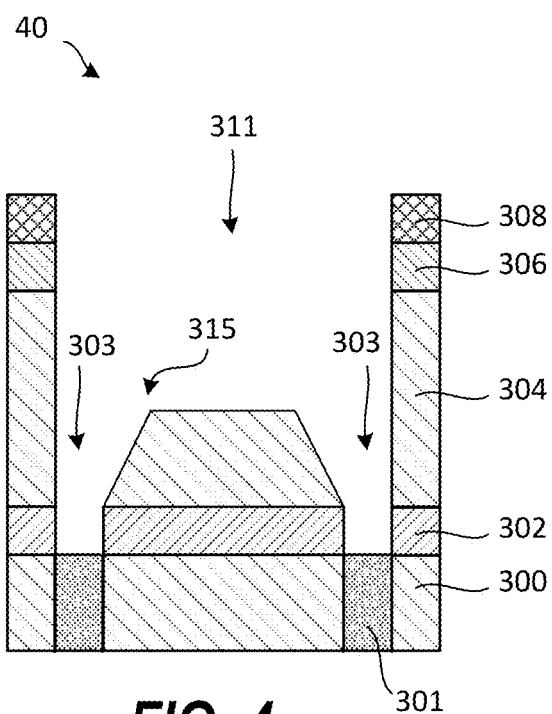
FIG. 4 schematically shows a cross-sectional view a patterned substrate.

According to one embodiment, the patterned substrate 30 in FIG. 3E may be etched to form a trench 311 and extend the vias 303 through the etch stop layer 302 to the metal line 301. This is schematically shown in FIG. 3F. The presence of the $SiO_x$ film 309 helps to better preserve the corner 313 between the vias 303 and the trench 311, thereby resulting in a high chamfer angle. The $SiO_x$ film 309 is denser than the SiCOH layer 304 and this results in a lower etch rate of the $SiO_x$ film 309 than the SiCOH layer 304 during the etch process. For comparison, as schematically shown for the patterned substrate 40 in FIG. 4, the absence of the a $SiO_x$ film 309 results in a sloped chamfer and a low chamfer angle at the corner 315 between the vias 303 and the trench 311. Further, the $SiO_x$ film 309 protects the dielectric surfaces in the vias 303 from carbon depletion during the trench etch.

Figure 9A:
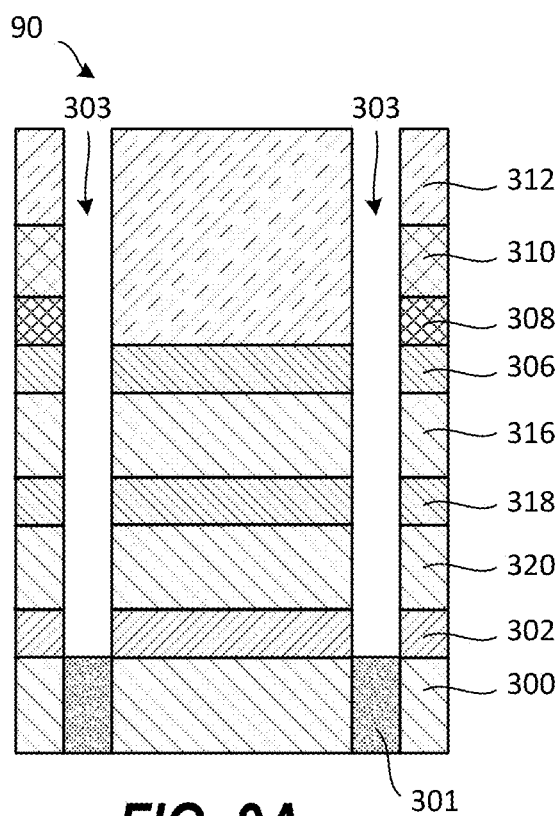
FIGS. 9A and 9B schematically shows through cross-sectional views a method of processing a patterned substrate according to an embodiment of the invention.
Figure 9B:
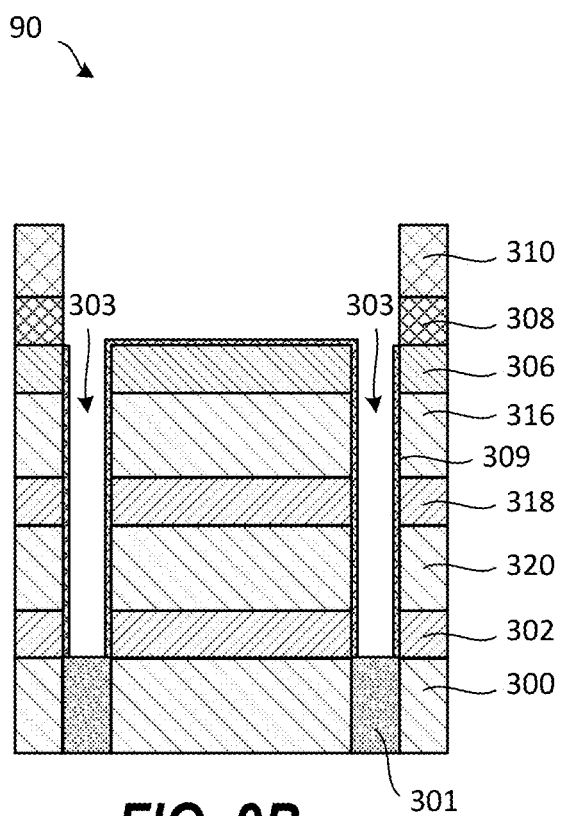

FIGS. 9A and 9B schematically shows through cross-sectional views a method of processing a patterned substrate according to an embodiment of the invention. The patterned substrate 90 is similar to the patterned substrate 30 in FIG. 3A but the SiCOH layer 304 has been replaced by a plurality of dielectric layers. The plurality of dielectric layers may be low-k layers. In this example, the SiCOH layer 304 has been replaced by a first dielectric layer 316, an etch stop layer 318, and a second dielectric layer 320. The first dielectric layer 316 and the second dielectric layer 320 may have different chemical composition and density, thus displaying different etch behavior. The formation of the $SiO_x$ film 309 can be used to improve the profile of the pattern (e.g., via, trench) etched into the patterned substrate 90, including minimizing bowing or undercutting between a softer (lower density) and a harder (higher density) dielectric layers.

Figure 5A:
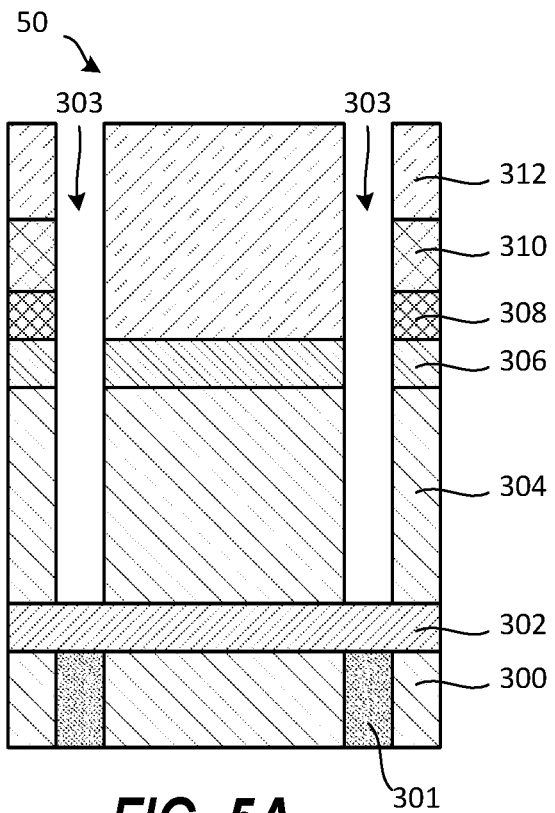
Figure 5B:
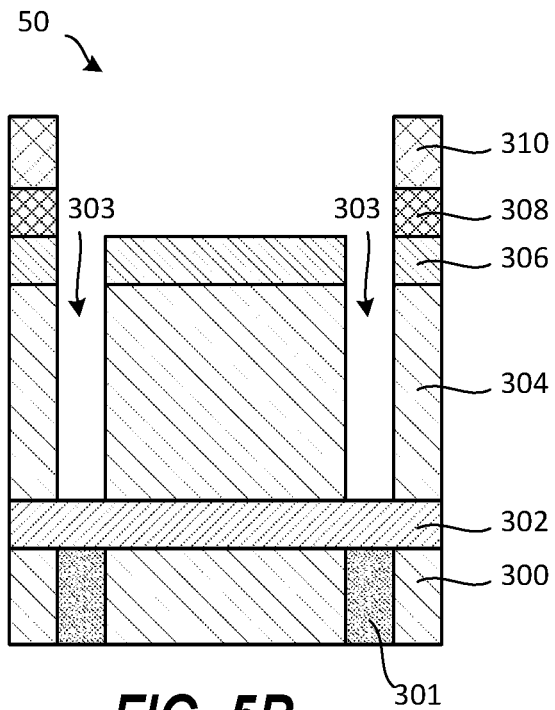
Figure 5C:
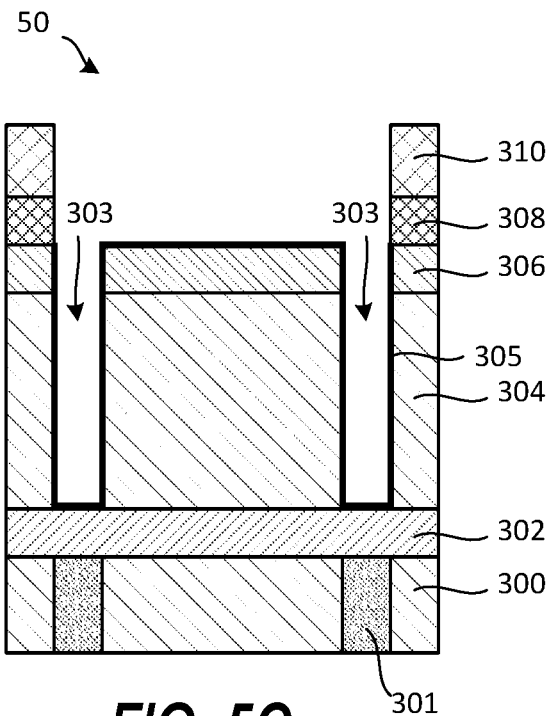
Figure 5D:
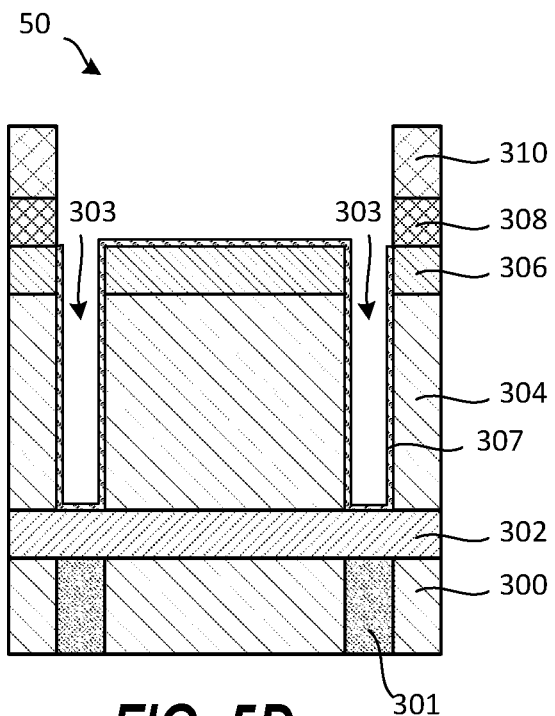

FIGS. 5A-5F schematically show through cross-sectional views a method of processing a patterned substrate according to an embodiment of the invention. The method includes forming vias 303 in the patterned substrate 50 by gas phase etching, removing the OPL 312 (FIG. 5B), exposing the patterned substrate 50 to an oxygen-based ashing process to creates Si—OH surface termination 305 on the surfaces of the dielectric hardmask 306, the SiCOH layer 304, and the etch stop layer 302 (FIG. 5C). The Si—OH surface termination 305 is silylated by an exposure to a silanizing reagent to form a $SiO_x$ film 307 on the dielectric hardmask 306, the SiCOH layer 304, and the etch stop layer 302 in the vias 303 (FIG. 5D). The processing may be repeated to form a $SiO_x$ film 309 (FIG. 5E). Thereafter, a trench etching process may be carried out to form trench 311 and extend the vias 303 through the etch stop layer 302 to the metal line 301 (FIG. 5F).

Figure 6A:
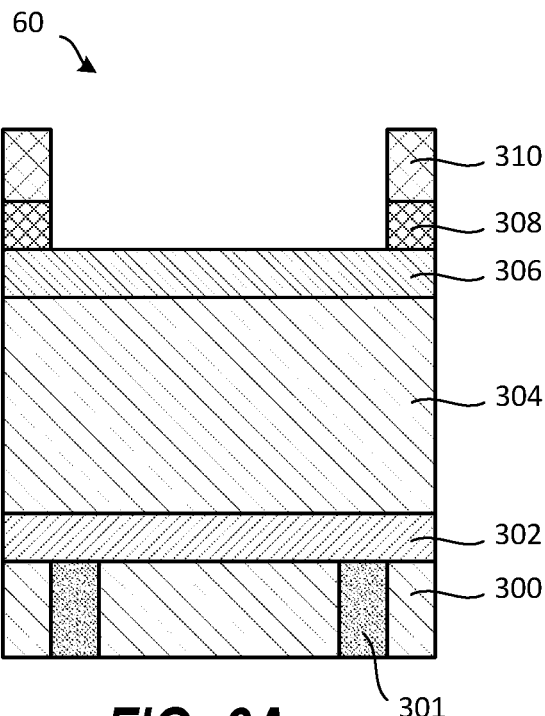
FIGS. 6A-6E schematically shows through cross-sectional views a method of processing a patterned substrate according to an embodiment of the invention.
Figure 6B:
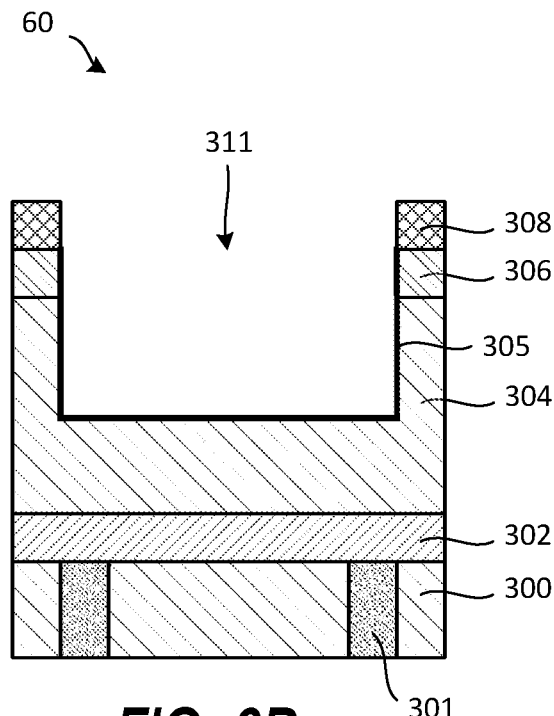
Figure 6C:
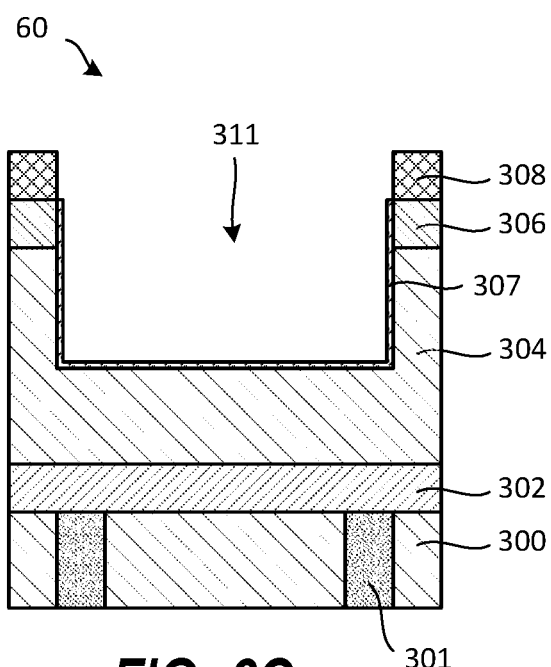
Figure 6D:
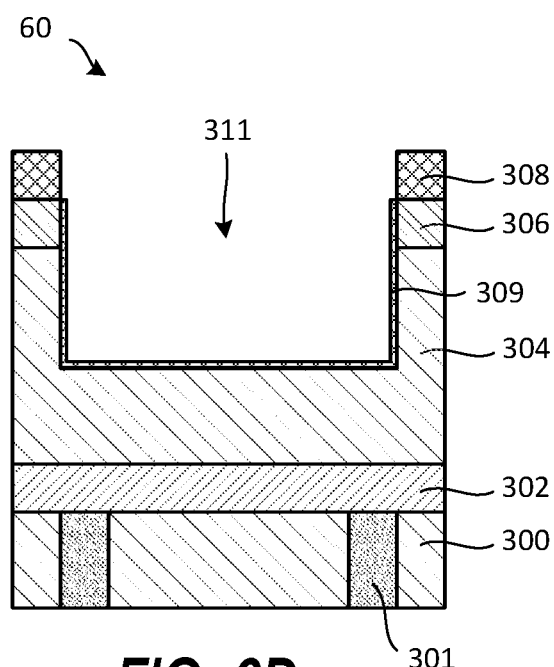
Figure 6E:
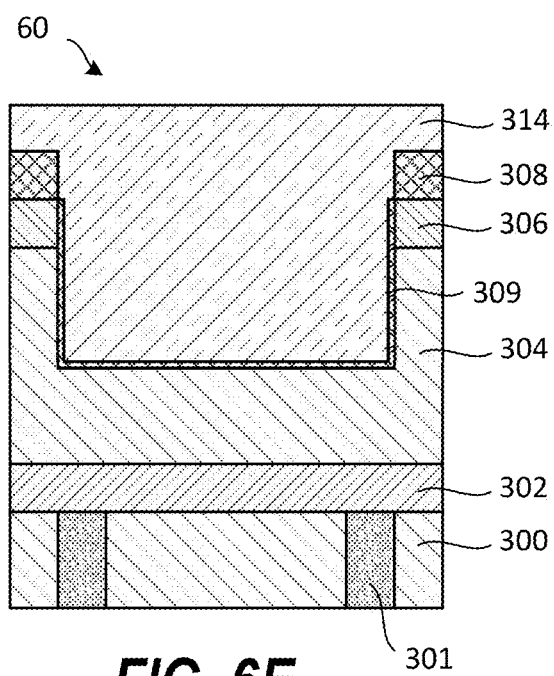

FIGS. 6A-6D schematically shows through cross-sectional views a method of processing a patterned substrate according to an embodiment of the invention. The method includes performing trench hard mask patterning of patterned substrate 60 (FIG. 6A), performing a trench etch process to form a trench 311 and exposing the patterned substrate 60 to an oxygen-based ashing process to create Si—OH surface termination 305 on the surfaces of the dielectric hardmask 306 and the SiCOH layer 304 (FIG. 6B). The Si—OH surface termination 305 is silylated by an exposure to a silanizing reagent to form a $SiO_x$ film 307 on the dielectric hardmask 306 and the SiCOH layer 304 (FIG. 6C). The processing may be repeated to form a $SiO_x$ film 309 (FIG. 6D). The patterned substrate 60 in FIG. 6D may be further processed by forming a planarization layer 314 that fills the trench 311. The $SiO_x$ film 309 functions as a barrier layer and suppresses the interaction between the SiCOH layer 304 and the planarization layer 314. The planarization layer 314 can be an organic material or can contain amount of Si.

Figure 7A:
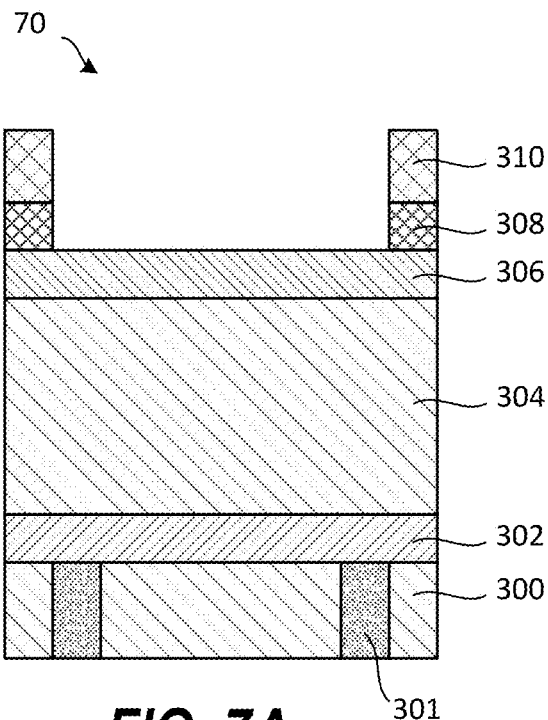
FIGS. 7A-7D schematically shows through cross-sectional views a method of processing a patterned substrate according to an embodiment of the invention.
Figure 7B:
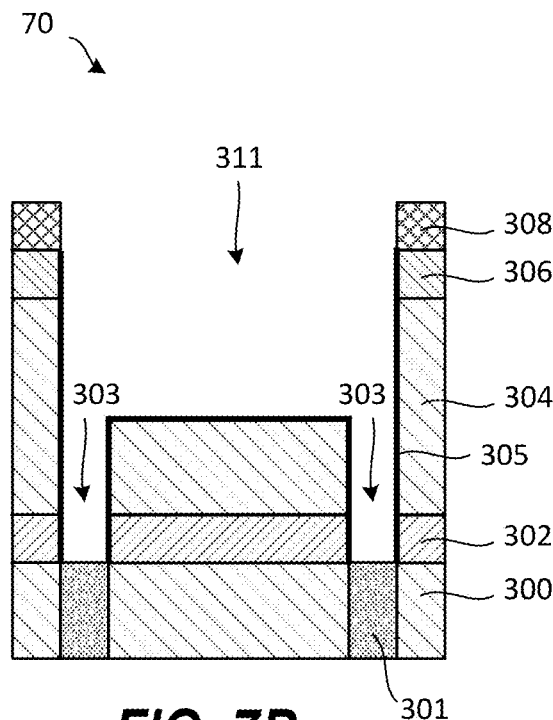
Figure 7C:
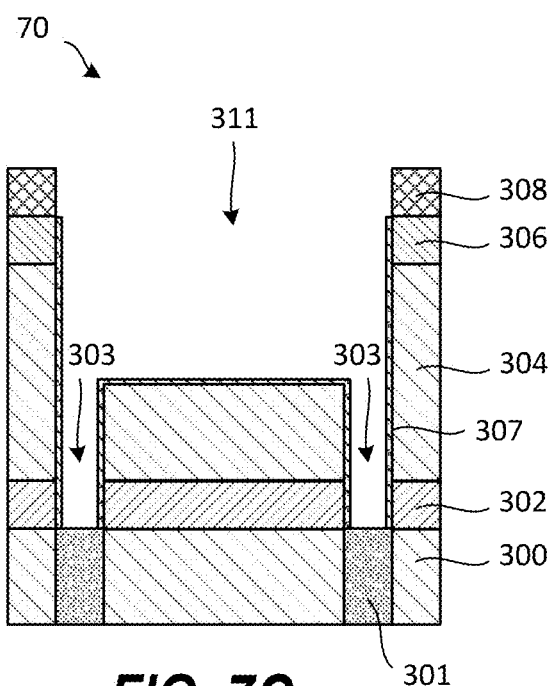
Figure 7D:
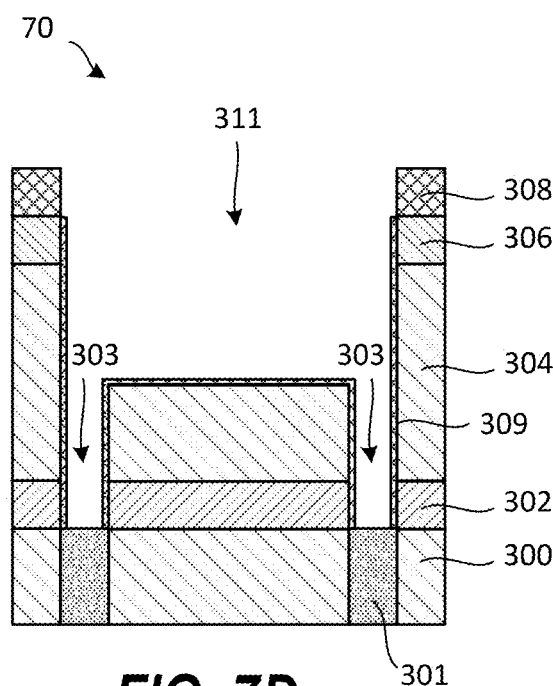

FIGS. 7A-7D schematically shows through cross-sectional views a method of processing a patterned substrate according to an embodiment of the invention. The method includes performing trench hard mask patterning of patterned substrate 70 (FIG. 7A), performing a via etch process to forms vias 303, performing a trench etch process to form a trench 311, and exposing the patterned substrate 70 to an oxygen-based ashing process to create Si—OH surface termination 305 on the surfaces of the dielectric hardmask 306 and the SiCOH layer 304 (FIG. 7B). The Si—OH surface termination 305 is silylated by an exposure to a silanizing reagent to form a $SiO_x$ film 307 on the dielectric hardmask 306 and SiCOH layer 304 (FIG. 7C). The processing may be repeated to form a $SiO_x$ film 309 (FIG. 7D).

Examples of pore sealing of porous low-k material.

In addition to enabling deposition of a thin dielectric film (e.g., $SiO_x$) on low-k materials by alternating surface functionalization and silanizing, some embodiments of the inventions may be used to seal the pores of porous low-k materials.

Figure 8A:
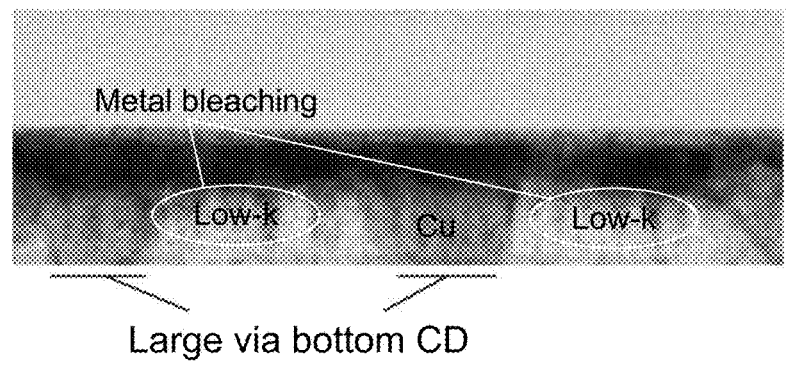
FIGS. 8A and 8B show cross-sectional transmission electron microscopy (TEM) images of the effect of thin a $SiO_x$ film on metal bleaching of a porous low-k material according to an embodiment of the invention.
Figure 8B:
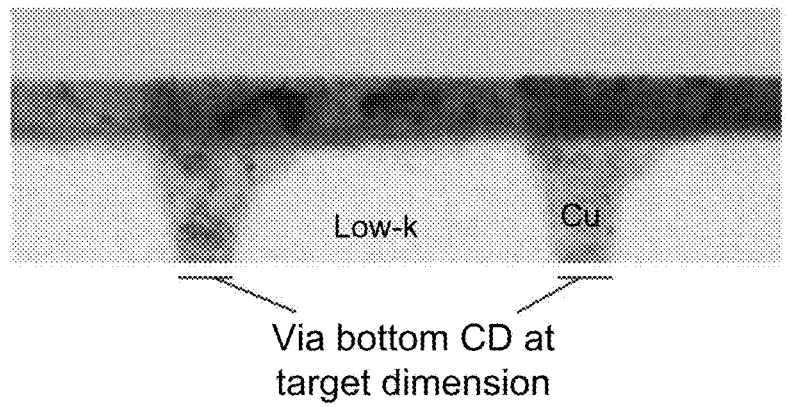

FIGS. 8A and 8B show cross-sectional TEM images of the effect of a thin $SiO_x$ film on metal bleaching of a porous low-k material according to an embodiment of the invention. FIG. 8A shows Cu line bleaching through a metal-containing barrier layer into a porous spin-on low-k material. A barrier layer and a Cu line were deposited into recessed features in the low-material. The Cu metallization process causes the Cu line bleaching due to the weakness of the low-k material and the pores' interconnectivity. In FIG. 8B, a thin $SiO_x$ film was selectively deposited on the low-k material using 10 process cycles of $CO_2$ plasma treatment and TMSDMA exposure. This image shows that the presence of the thin $SiO_x$ film was able to seal the pores at the surface and create a dense surface film. This thin $SiO_x$ film eventually was able to withstand the barrier metal deposition and the Cu filling process and provide a well-defined metal and low-k material interface with no Cu line bleaching. Further, another difference between FIGS. 8A and 8B is the large via bottom CD in FIG. 8A compared to the smaller target via bottom CD on FIG. 8B. This shows the benefit of the thin $SiO_x$ film to mitigate the low-k material damage according to an embodiment of the invention.

According to one embodiment, the process cycles described above may be performed in two different process chambers, where one process chamber includes an etch chamber configured for etching the dielectric material (via and trench patterns). The step of surface functionalization of the dielectric material by means of plasma processing (e.g., plasma oxidation containing $O_2$ gas or $CO_2$ gas) may also be performed in the etch chamber. The silanizing step may be performed in another process chamber that may be at an elevated temperature to thermally activate the silanizing reaction.

According to another embodiment, the process cycles may be performed in a single process chamber configured for performing etching, surface functionalization, and silanizing.

A plurality of embodiments for a method of processing a dielectric material have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A substrate processing method, comprising:
    providing a patterned substrate containing vias etched through a dielectric material and through an organic planarization layer (OPL) overlying the dielectric material, the OPL defining an outer surface of the patterned substrate;
    exposing the patterned substrate to a gas phase plasma to functionalize a surface of the dielectric material and remove a portion of a thickness of the OPL without removing the entire OPL;
    exposing the patterned substrate to a silanizing reagent that reacts with the functionalized surface of the dielectric material to form a dielectric film on the dielectric material; and
    sequentially repeating the exposing steps at least once to increase a thickness of the dielectric film and further remove the OPL.

2. The method of claim 1, wherein the silanizing reagent has the chemical formula $R_nSiX_{4-n}$, where R is an alkyl group or a functional chain, X is OR, $NH_2$, or $NR_2$, and n=0-4.

3. The method of claim 1, wherein the dielectric material includes a low-k material, $SiO_2$, SiN, SiCN, SiC, SiCOH, organo silicate glass (OSG), or carbon doped oxide (CDO).

4. The method of claim 1, wherein the gas phase plasma is $N_2$-based, $N_2/H_2$-based, $O_2$-based, $CO_2$-based, COS-based, $NH_3$-based, $H_2$-based, or $H_2O$-based.

5. The method of claim 1, wherein the functionalized surface of the dielectric material includes —OH species, —NH species, or —SH species.

6. The method of claim 1, wherein the silanizing reagent includes an alkyl amine silane.

7. The method of claim 1, wherein the silanizing reagent includes dimethylsilane dimethylamine (DMSDMA), trimethylsilane dimethylamine (TMSDMA), bis(dimethylamino) dimethylsilane (BDMADMS), or tetramethyldisilazane (TMDS).

8. The method of claim 1, wherein the dielectric film includes $SiO_x$, $SiN_x$, $SiO_xN_y$, or a combination thereof.

9. The method of claim 1, wherein the dielectric material includes a porous low-k material and the dielectric film seals pores on the functionalized surface of the porous low-k material.

10. The method of claim 1, wherein the sequentially repeating the exposing steps fully removes the OPL.

11. The method of claim 1, further comprising:
    etching the patterned substrate to extend the vias through an etch stop layer underlying the dielectric material and remove at least a portion of the dielectric material to form a trench between the vias.

12. The method of claim 11, wherein the dielectric film on the dielectric material in the vias preserves the corners between the vias and the trench.

13. The method of claim 12, wherein the corners between the vias and the trench are right angles.

14. A substrate processing method, comprising:
    providing a patterned substrate containing vias etched through a SiCOH layer and through an organic planarization layer (OPL) overlying the SiCOH layer, the OPL defining an outer surface of the patterned substrate;
    exposing the patterned substrate to an $O_2$-based or $CO_2$-based gas phase plasma to functionalize a surface of the SiCOH layer and remove a portion of a thickness of the OPL without removing the entire OPL;
    exposing the patterned substrate to a silanizing reagent that reacts with the functionalized surface of the SiCOH layer to form a SiOx film on the SiCOH layer; and
    sequentially repeating the exposing steps at least once to increase a thickness of the SiOx film and further remove the OPL.

15. The method of claim 14, wherein the silanizing reagent has the chemical formula $R_nSiX_{4-n}$, where R is an alkyl group or a functional chain, X is OR, $NH_2$, or $NR_2$, and n=0-4.

16. The method of claim 14, wherein the functionalized surface of the SiCOH layer includes —OH species.

17. The method of claim 14, wherein the silanizing reagent includes dimethylsilane dimethylamine (DMSDMA), trimethylsilane dimethylamine (TMSDMA), bis(dimethylamino) dimethylsilane (BDMADMS), or tetramethyldisilazane (TMDS).

18. The method of claim 14, wherein the sequentially repeating the exposing steps fully removes the OPL.

19. The method of claim 14, further comprising:
    etching the patterned substrate to extend the vias through an etch stop layer underlying the SiCOH layer and remove at least a portion of the SiCOH layer to form a trench between the vias.

20. The method of claim 19, wherein the SiOx film on the SiCOH layer in the vias preserves the corners between the vias and the trench.

21. The method of claim 20, wherein the corners between the vias and the trench are right angles.

* * * * *